United States Patent [15] 3,652,904
Takahashi et al. [45] Mar. 28, 1972

[54] SEMICONDUCTOR DEVICE

[72] Inventors: Kazusaburo Takahashi; Takeshi Sasaki; Hisauke Takeuchi; Keiichi Morita; Tadatoshi Toda, all of Hitachi, Japan

[73] Assignee: Hitachi, Ltd., Tokyo, Japan

[22] Filed: Mar. 31, 1970

[21] Appl. No.: 24,146

[30] Foreign Application Priority Data

Mar. 31, 1969 Japan....................................44/23840

[52] U.S. Cl...................317/234 M, 317/234 G, 317/234 M, 317/234 P

[51] Int. Cl...........................................................H01l 5/02

[58] Field of Search...........................317/234, 5.2, 5.3, 15.2

[56] References Cited

UNITED STATES PATENTS 3,396,316 8/1968 Wislocky...............................317/234
3,512,053 5/1970 Andersson et al.....................317/234
3,532,941 10/1970 Boyer....................................317/234

*Primary Examiner*—John W. Huckert
*Assistant Examiner*—E. Wojciechowicz
*Attorney*—Craig, Antonelli & Hill

[57] ABSTRACT

A semiconductor device comprising a semiconductor wafer, a base electrode soldered to one face of the wafer, a first conductive block secured to the base electrode, a second conductive block being in slidable contact with the other face of the wafer, an annular insulator soldered to the first conductive block, a flexible sheet being so secured to the annular insulator as to seal the wafer off from the atmosphere, and means for compressing the conductive blocks to the wafer, characterized in that a hard and thin metallic film is formed on the surface of the second conductive block, whereby a sticking caused between the second conductive block and the wafer can be prevented.

24 Claims, 6 Drawing Figures

PATENTED MAR 28 1972 3,652,904

SEMICONDUCTOR DEVICE

BACKGROUND OF THE INVENTION

1. Field of the Invention

This invention relates to an improvement in a semiconductor device in which a conductive block having good electrical and thermal conductivity is compressed to a semiconductor wafer with slideability in the radial direction of the wafer and more particularly, to an improved semiconductor device possessing excellent sticking resistance characteristics.

2. Description of the Prior Art

In large current semiconductor devices, the semiconductor wafers tend to be broken by the difference between thermal expansion coefficients of the semiconductor and the conductive blocks for carrying heat and current. Through the semiconductor wafer is provided with a pair of base electrodes made of tungsten or molybdenum, which has a thermal expansion coefficient as close as possible to that of the wafer, stresses owing to heat cycles cause the breakage of the wafer.

From the above, there have been provided semiconductor devices of the compression type in which conductive blocks to be provided in contact with the wafer are not firmly secured to the base electrode, so as to provide a slideability along the surface between the electrode and the conductive block. In the semiconductor devices of this type, the sliding movement of the conductive block with respect to the base electrode is produced by the expansion and shrinkage due to thermal effects. According to the semiconductor device of this type, one of the base electrodes is omitted to reduce the thermal and electrical resistance between the conductive block and the wafer. In accordance with our many experiments, however, it has been experienced that when a current flows in the device, an undesirable sticking takes place at the contact surfaces between the conductive block and the wafer. This undesirable sticking which is a kind of soldering or welding is caused by mutual melting of the conductive block and an electrode alloyed to the surface of the wafer or an ohmic electrode adhering to the wafer. As a result of the sticking, the slideability of the conductive block disappears thereby causing the breakage of the wafer.

SUMMARY OF THE INVENTION

Accordingly, one of the objects of the present invention is to provide an improved semiconductor device having an excellent non-sticking property for the conductive block with respect to the semiconductor wafer.

Another object of the invention is to provide an improved semiconductor device useful for large current devices, because of its improved non-sticking property for the conductive block with respect to the wafer.

A further object of the invention is to provide a novel semiconductor device having a very long service life of operation without losing its predetermined electrical characteristics.

Basically, the present invention provides such a semiconductor device wherein the conductive block to be compressed to the wafer is provided with a thin metallic film made of a material of a melting point and hardness considerably higher than those of the conductive block, so that the undesirable sticking prevalent in prior devices can be avoided. The present invention is based upon the discovery that since the sticking is caused by the mutual melting between the conductive block and the ohmic electrode the sticking can be prevented by provision of the film mentioned above on the surface of the conductive block. Since the material for the conductive block is necessarily limited by reason of its electrical and thermal conductivities and therefore, the conductive block cannot be made of a metallic material of high hardness and high melting point, the formation of the thin film on the surface of the conductive block may be most adequate.

The above objects and other objects and features of the present invention will be apparent from the foregoing description and appended claims, taken in conjunction with the attached drawings.

DETAILED DESCRIPTION OF THE PREFERRED EMBODIMENTS

Figure 1:
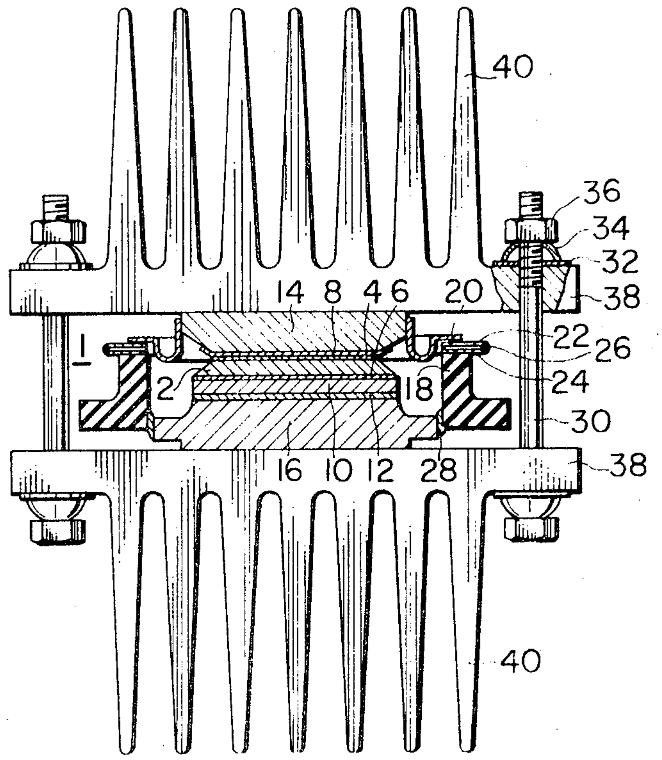
FIG. 1 shows a longitudinal sectional view of a semiconductor device embodying the present invention.

In the semiconductor device according to the present invention, a base electrode having a thermal expansion coefficient near that of the wafer is secured by soldering and, the base electrode is also soldered to a conductive block. On the contrary, the face of the wafer opposite to the conductive block is in contact with the surface of a second conductive block so that the second conductive block can slide along the surface of the wafer. Since the difference between thermal expansion coefficients of the conductive block made of copper and the wafer made of silicon is $16.5 \times 10^{-6}$ and $3.6 \times 10^{-6}$, respectively, the sliding movement is very large. In addition, since the heat generation is caused by overcurrents or discontinuous load applications, the sliding movement may be a certain complex thermal shock movement. Since in order to obtain good thermal and electrical conductivities between the wafer and the conductive block, the wafer and the block are highly compressed to each other, the wafer necessarily is subjected to the application of large stresses. Accordingly, the contact surfaces of the wafer and the conductive block must be so constructed as to overcome the severe thermal and mechanical stresses mentioned above.

The semiconductor device according to the present invention is characterized in that the surface of the conductive block compressed slidably to the opposing face of the wafer is covered with a metallic thin film having a considerably high hardness and melting point so that the mutual melting between the materials of the conductive block and the ohmic electrode or alloying electrode formed on the wafer, which tends to cause the undesirable sticking, can be prevented. If the connection caused by the sticking is weak, the sticking will not bring about any drawbacks.

In general, the metallic materials having the high hardness and melting point have large thermal and electrical resistances and therefore, the smaller the thickness of the film the smaller the resistances will become. From the viewpoint of the service life, since the contact surfaces are subject to severe friction and sliding movement, a thickness capable of standing the mechanical stresses and wear will be required. If the thickness is too small, the surface of the conductive block will be exposed by peeling or wearing of the film. As the minimum thickness of the film depends upon the thermal and electrical resistances of the material, it may be difficult to show the minimum value with respect to the film of every material. According to our many experiments, it has been found that about $5\mu$ may be the minimum thickness of the film. However, it should be recognized that the above thickness is not the general limitation with respect to every material.

The thin metallic films are formed by electroplating, electroless plating, vacuum vaporization, sputtering, plasma jet coating or other suitable methods. It goes without saying that if the surface of the film formed by the above-mentioned methods is not smooth enough to provide a flat contact between the surfaces of the conductive block and the wafer, the surface of the film should be worked to make it highly smooth by any suitable manner, such as wrapping.

As the materials for the thin metallic film to be formed on the surface of the conductive block, the following materials may be used preferably.

(I) Tungsten, molybdenum, tungsten-cobalt alloy, molybdenum-cobalt alloy and tungsten-nickel alloy.

(II) Cobalt base alloy, such as for example, a. 64% Co–28%Cr–6% W–1%C–0.6%Si–0.4%Mn b. 59%Co–29%Cr–9%W–1.8%C–0.8% Si–0.4%Mn c. 50%Co–33%Cr–13%W–2.5%C–0.8%Si–0.7%Mn d. 42 52%Co–19%Cr–8 15%W–1%C–2.5 3%Si–13%Ni–1.5 3%B These materials have a hardness of about 750 Hv.

(III) High speed steels, such as for example a. 14%W – 4%Cr – 0.7%C – 2%V – Fe bal.

b. 18%W – 4%Cr – 0.7%C – 1.5%V – 10%Co – Fe bal.

c. 22%W – 4%Cr – 0.75%C – 1.5%V – 2%Mo – Fe bal.

(IV) Carbide distributing material comprising fine carbides distributed in a binder, which comprises tungsten carbide, titanum carbide or tantalum carbide and a binder such as cobalt, nickel, iron, manganese or chrominum, such as for example, a. 88.25%W – 6%Co – 5.75%C b. 71.7%W – 20%Co – 2.7%Ta – 0.9%Nb – 4.7%C c. 67%W – 3%Co – 1%Ni – 2%Cr – 7.2%Ta – 10%Ti – 2.4%Nb – 7.4%C (V) Combination of the foundation plating or coating and the film mentioned above.

In our experiments, the following electrolytes for the electroplating of the film in the group (I) were used.

A. W-Co alloy plating
- i. Composition of the electrolyte
  - Sodium wolfrate $Na_2WO_4 \cdot 2H_2O$ — 60 g./l.
  - Cobalt sulfate $CoSO_4 \cdot 7H_2O$ — 20 g./l.
  - Ammonium tartarate $(NH_4)_2C_4H_4O_6$ — 60 g./l.
  - Ammonium chloride $NH_4Cl$ — 50 g./l.
- ii. Current density — 3 a./dm.²

B. Mo-Co alloy plating
- i. Composition of the electrolyte
  - Sodium molybdenate $Na_2MoO_4 \cdot H_2O$ — 48 g./l.
  - Cobalt sulfate $CoSo_4 \cdot 7H_2O$ — 18 g./l.
  - Sodium citrate $N_{a3}C_6H_5O_7 \cdot 1\frac{1}{2}H_2O$ — 105 g./l.
- ii. Current density — 10 a./dm.²

C. W-Ni alloy plating
- i. Composition of the electrolyte
  - Sodium wolfrate $Na_2WO_4 \cdot 2H_2O$ — 50 g./l.
  - Nickel sulfate $NiSO_4 \cdot 6H_2O$ — 20 g./l.
  - Citric acid $C_6H_8O_7$ — 72 g./l.

molybdenum, and the electrode 10 is also soldered by a suitable solder 12, such as a gold solder, to a conductive block 16 made of a material of high thermal and electrical conductivities. Another face of the wafer 2 is provided with an ohmic electrode or an alloying electrode 4 made of gold-copper-gold or gold-antimony alloy for example. A surface of the thin film 8 formed on the conductive block 14 is in contact with the surface of the electrode 4. An annular insulator 18 having a flange portion is connected to an annularly shaped sealing member 20 through connecting members 22 and 24 and to the conductive block 16. The connecting members 22 and 18 and the sealing member 20 are welded so as to seal off the semiconductor unit 1 in an airtight manner. The connecting members 22 and 24 are welded to each other. The sealing member and the connecting members 22 and 24 are soldered to each other.

The semiconductor unit 1 is held between a couple of cooling blocks 38 provided with fins 40, and connected through insulated bolts 30 and nuts 36. The semiconductor unit 1 and the cooling blocks 38 are compressed by means of springs 34, thereby to provide a high compression between the wafer 2 and the conductive block 14.

Figure 2:
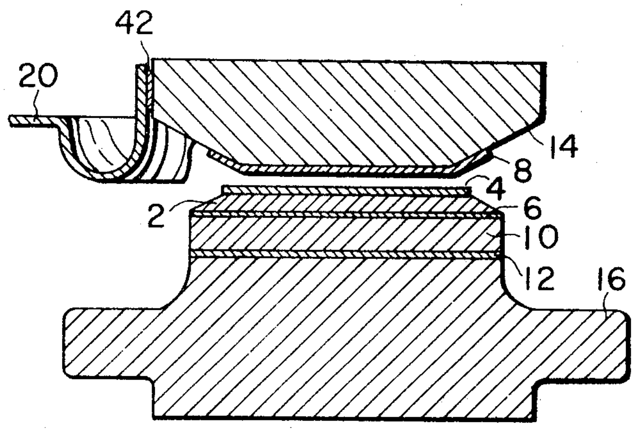
FIG. 2 shows an enlarged sectional view of the dominant portion of the semiconductor device shown in FIG. 1.

As shown in FIG. 2, a metallic thin film 8 having a considerably high melting point and hardness is formed on the surface of the conductive block 14, into which the surface of the film 4 is worked in order to produce the highly smooth surface when the film is formed by sputtering.

It is preferable that the edge of the conductive block opposing the surface of the alloying electrode 4 is made with a gentle slope so as to moderate or reduce the field strength in the vicinity thereof and the edge of the film is so formed as to extend to the side face of the conductive block.

Experiments in connection with the semiconductor device shown in FIGS. 1 and 2 were conducted. The contact area of the conductive block and the wafer, i.e., the film 8 and the alloying electrode 4, was 5cm.², to the applied current was 500a. The temperature change was about 175° C. To produce the above temperature change, conduction and cooling conditions were properly regulated.

Figure 4:
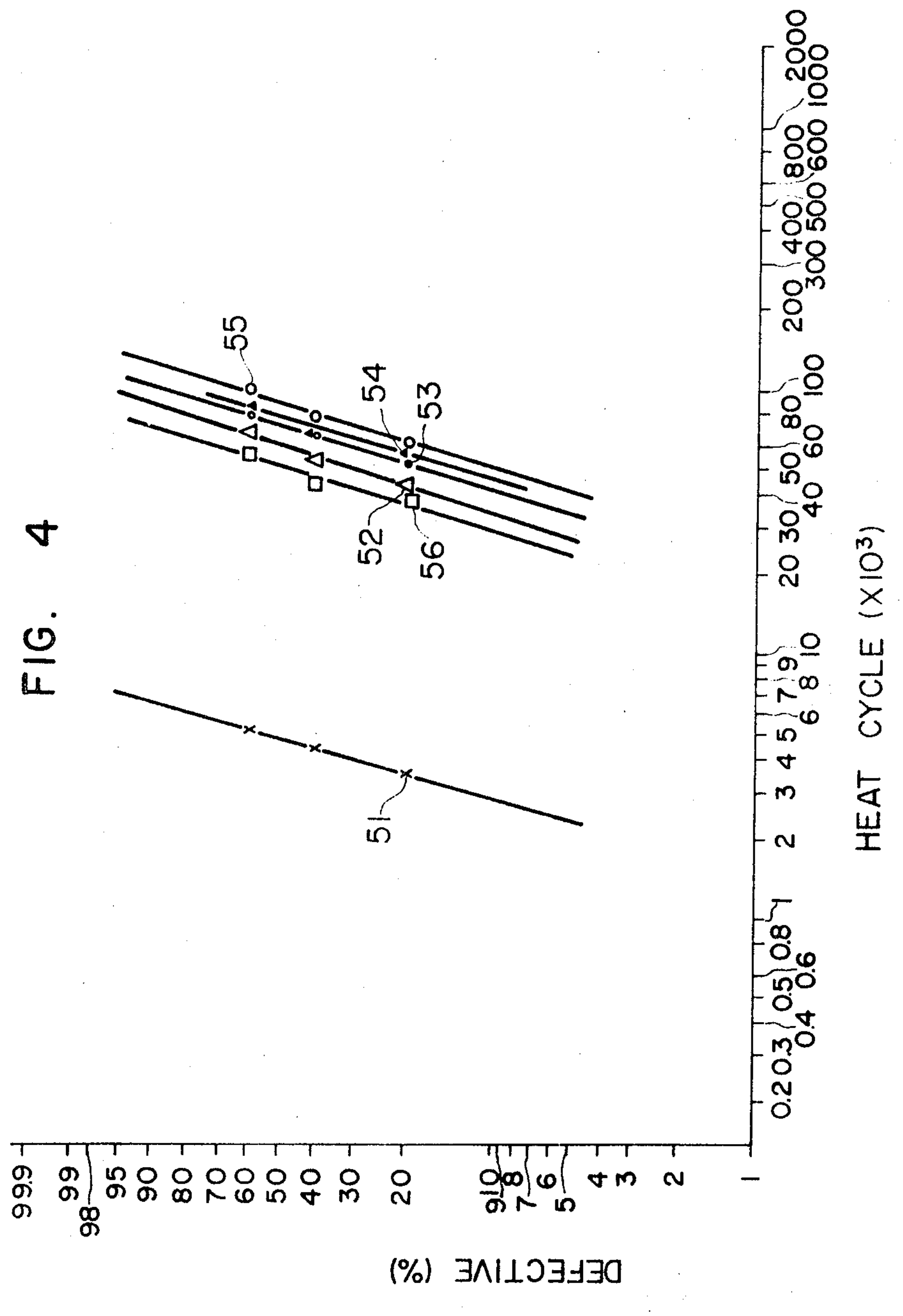
FIG. 4 is a graph showing relationships between the rate of rejected devices and the operating cycles corresponding to the heat cycles with respect to the semiconductor devices of the invention and the conventional devices.
Figure 5:
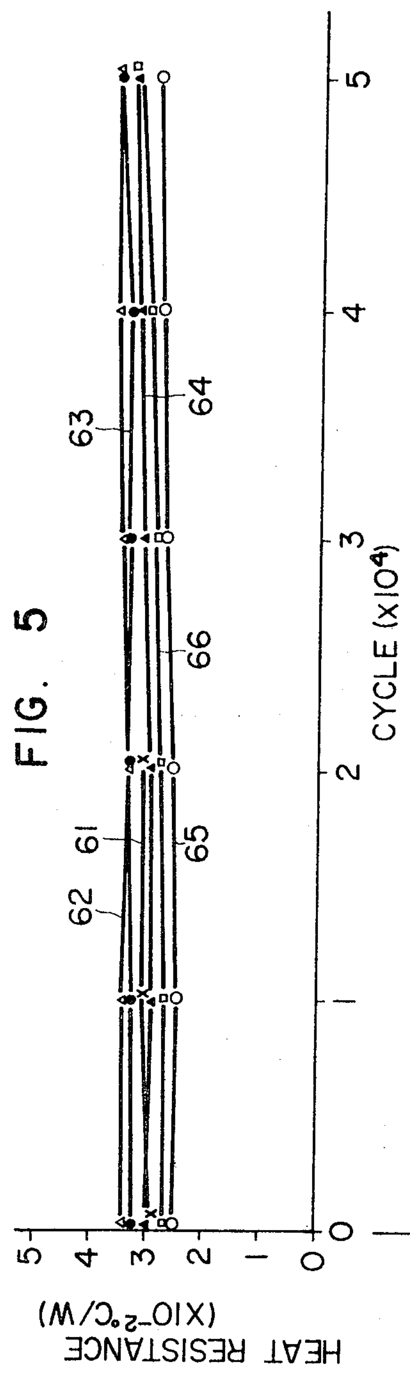
FIG. 5 is a graph showing relationships between heat resistances in the direction traversing the conductive block and the wafer and operating cycles.
Figure 6:
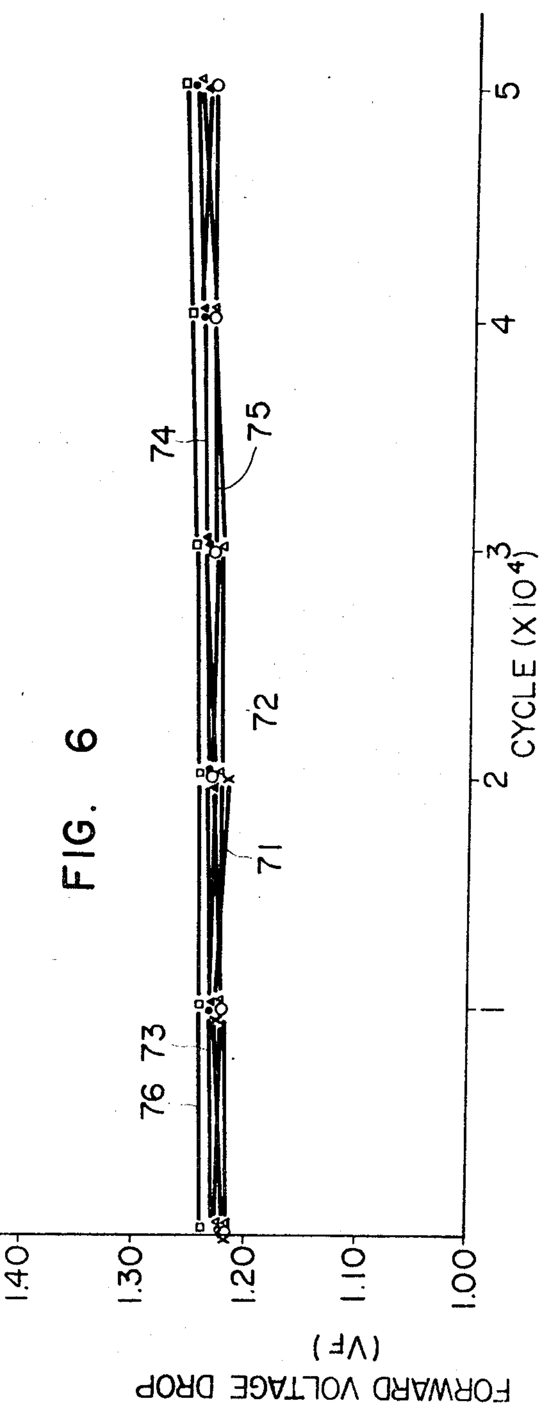
FIG. 6 is a graph showing forward voltage drops of the semiconductor devices and the operating cycles.

The test results are shown in Table 1 and FIGS. 4 to 6. In Table 1, specimens No. 6 and 7 are shown in comparison with the semiconductor devices according to the present invention. The thickness of the films of the specimens No. 1 to 5 are about 10$\mu$.

TABLE 1

| Specimen Number | Method of film forming | Cycles | Rate of rejected device | Condition of the contact face | Note |
|---|---|---|---|---|---|
| 1 | W plasma jet | 50,000 | Less than one fifth. | Good, no appearance of sticking. | No decrease of forward voltage down, and negligibly small thermal resistance. |
| 2 | Mo plasma jet | 42,000 | do | do | Do. |
| 3 | W-Co alloy electroplating | 60,000 | do | do | Do. |
| 4 | Mo-Co alloy electroplating | 55,000 | do | do | Do. |
| 5 | W-Ni alloy plating | 40,000 | do | do | Do. |
| 6 | Space in the semiconductor unit was filled with silicone oil. | 60,000 | do | do | Deterioration of the components. |
| 7 | Ni film formed by electroplating. | 5,000 | Three fifths. | A typical sticking | No resistance to sticking. |

pH of the electrolyte was prepared by an ammonium aqueous solution to 8.7
- ii. Current density — 2–2.5 a./dm.²
- iii. Plating temperature about 70° C.

By alteration of the composition of the above electrolytes, the compositions of the plated film can be controlled. From its purpose of the film formation, the rate of molbdenum and tungsten in the film may preferably be greater than about 25 percent.

Referring to FIG. 1, one face of a semiconductor wafer 2 is soldered by a suitable solder 6, such as for example an aluminum solder, to a base electrode 10 made of tungsten or FIG. 4 shows results of heat cycle tests of 10 specimens with respect to the semiconductor devices of the invention and the conventional ones. Lines 52 to 56 show results of the devices of the invention and line 51 shows results of the conventional ones corresponding to specimen No. 7 in Table 1. From FIG. 4, it will be apparent that all the semiconductor devices of the invention have excellent heat cycle characteristics as compared with the conventional ones.

Referring to FIG. 5, in which lines 62 to 66 show results in connection with heat cycle characteristics of the devices corresponding to respective specimen Nos. 1 to 5 in Table 1 and line 61 shows results in connection with that of the conventional devices corresponding to specimen No. 7. From the results shown in FIG. 5, the semiconductor devices have a small and stable heat resistance for long periods, whereas the conventional devices became unusable after about 20,000 heat cycles.

In FIG. 6, lines 72 to 76 show results of devices of the invention, which correspond to the specimen Nos. 1 to 5, and line 71 shows results of conventional devices corresponding to specimen No. 7. According to FIG. 6, the forward voltage drops of the devices of the invention are stable for long periods, whereas the conventional devices deteriorated so as to become unusable after about 20,000 heat cycles.

From the above-mentioned facts, the semiconductor devices of the invention have excellent heat cycle characteristics and non-sticking characteristics. The connectional devices lost the slideability between the conductive block and the wafer because strong sticking took place at the contact faces.

From the results, it will be found that, W–Co alloy electro plating film has most excellent heat cycle characteristics or non-sticking characteristics.

After many experiments, it was found that in the all-diffusion type semiconductor devices the heat cycle characteristics and non-sticking characteristics were considerably improved by provision of a suitable foil between the thin film on the conductive block and the ohmic electrode of the wafer.

That is, since in the case of the alloying type semiconductor devices the alloying electrode alloyed on the surface of the wafer contains an impurity, such as for example antimony, for forming pn junction and silicon, the impurity and silicon contribute to the sticking resistance. During the alloying of the electrode material comprising a metal rich in spreading property and having good thermal conductivities and an impurity such as antimony, silicon diffuses in the electrode whereby fine and hard grains of silicon and intermetallic compound such as $AuSb_2$ are dispersed. Therefore, in the alloying type semiconductor devices the undesirable sticking can be prevented sufficiently because sticking takes place, if at all, only to a very insignificant extent.

On the contrary, it had been found that in the case of all-diffusion type semiconductor devices the ohmic electrode formed on the surface of the wafer does not contain silicon and any impurities such as antimony and therefore, in the device of this type the sticking caused between the film and the ohmic electrode tends to be strong.

Figure 3:
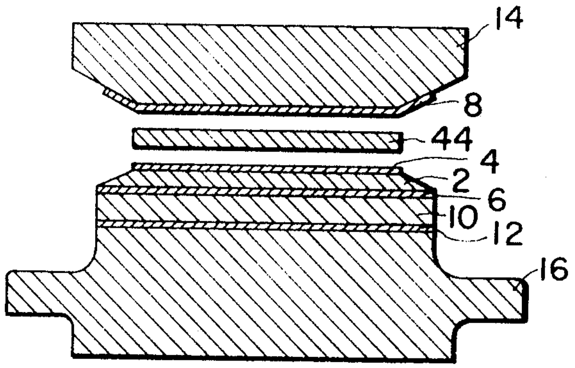
FIG. 3 shows an enlarged sectional view of the dominant portion of another semiconductor device of the invention.

In order to prevent such strong sticking, a suitable sticking resistance foil 44 is inserted and interposed between the film 8 and the ohmic electrode 4 as shown in FIG. 3.

As stated above, the undesirable sticking may be caused by the mutual melting between the conductive block and the ohmic electrode on the wafer. If the sticking is considerably weak, the non-sticking characteristic will be improved. From the above viewpoint, the insertion of non-sticking brittle foil is useful.

According to experiments, it has been found the following materials are useful as the sticking resistance foil.

(I) Au base alloys, such as Au–10%Si, Au–5%Te, Au–0.1%Si–10%Sb, Au–7%Si–1%Sb, Au–6%Si–1%Sb, Au–1%Sb, Au–6%Si, Au–Sn, Au–Th, Au–Zn, Au–In Au–Be, Au–Pb and so on.

In the above alloys, additive elements such as Si, In, Sb, Te, Th, Zn, Sn, Be and Pb form fine grains in the Au matrix to form a non-sticking layer. In the cases of Sb, Te, In, Sn, Th, Zn, Be and Pb, hard intermetallic compounds such as $AuSb_2$, $AuTe_2$, $Au_3Th$, $Au_3Be$, $Au_3Zn$, $Au_7In_3$, AuPb, AuSn are formed in the matrix.

(II) Cu base alloys such as Cu–Zn alloys, Cu–Sn–P alloys, Cu–Nb alloys. As the Cu–Zn alloys, 58%Cu–35%An–4%Mn–2%Si–aq% Al alloy can be used. As the Cu–Sn–P alloys Cu–10%Sn0.2%P alloy is used, in which as the intermetallic compounds $Cu_3Sn_4$, $Cu_4Sn$, $Cu_3P$ are formed. In the Cu–Nb alloys, $Cu_2Nb$ grains are dispersed in the Cu matrix.

EXAMPLE 1

A silicon rectifier having a semiconductor unit as shown in FIG. 3 was constructed. The wafer has 33mm.$\phi$ and 0.36mm. thickness, the base electrode 10 made of tungsten has 33mm.$\phi$and 2.5mm. thickness, the conductive block 14 and 16 are made of copper containing 0.06% of Ag. The base electrode 10 and the wafer 2 are soldered to the conductive block 16 and the base electrode 10 by Au solder and Al solder, respectively.

The thin film 8 was formed by the electro-plating using such electrolyte as comprising $Na_2WO_4 \cdot 2H_2O$ 60g./l. $CoSO_4 \cdot 7H_2O$ 20 g./l., $(NH_4)2\ C_4H_4O_6$ 60 g./l. and $NH_4Cl$ 50 g./l. The electrolyte has pH of 8.7. Electroplating conditions were 3 a./dm.$^2$ of current density and 75° C. of plating temperature. The resulting film has about 15$\mu$ thickness and 410Hv. of hardness.

On the surface of the ohmic electrode 4, which comprises thin layers of Au, Cu and Au, formed on the wafer 2, a sticking resistance foil 44 made of Au–1%Sb alloy and having 100$\mu$ thickness was interposed. The foil was prepared by rapidly cooling a molten metal on a water cooled copper plate. In the matrix of the material thus obtained, $AuSb_2$ grains are finely and homogeneously dispersed.

EXAMPLE 2

The thin film 8 of W–Co alloy was formed in the same manner as in Example 1.

A sticking resistance foil 44 having 100$\mu$ thickness was prepared from an alloy consisting of 7% of Si, 1% of Sb and the balance being Au. The molten metal comprising Au–7%Si–1%Sb was rapidly cooled on the water cooled copper plate thereby to produce the alloy material in which grains of Si and $AuSb_2$ were homogeneously distributed. The foil thus obtained was interposed on the wafer.

The heat cycle tests in connection with the semiconductor devices manufactured in Examples 1 and 2 were conducted. The applied current was 500a. and the temperature change was 175° C. The results are shown in Table 2.

TABLE 2

| | Number of heat cycles | Rejected device | Note |
|---|---|---|---|
| Example: | | | |
| 1 | 60,000 | Zero | Small forward voltage drop and small heat resistance. No sticking. |
| 2 | 60,000 | do | Do. |
| Comparison: | | | |
| 1 | 50,000 | Less than one fifth. | Slight sticking. |
| 2 | 5,000 | Three fifths | Sticking. |

4. A semiconductor device as defined in claim 1, wherein said thin metallic film is made from a tungsten-cobalt alloy.

5. A semiconductor device as defined in claim 1, wherein said thin metallic film is made from a molybdenum-cobalt alloy.

6. A semiconductor device as defined in claim 1, wherein said thin metallic film is made from a tungsten-nickel alloy.

7. A semiconductor device as defined in claim 1, wherein said thin metallic film is made from an alloy primarily comprising cobalt.

8. A semiconductor device as defined in claim 7, wherein said second conductive block is made of copper.

9. A semiconductor device as defined in claim 1, wherein said thin metallic film is made from a high speed steel.

10. A semiconductor device as defined in claim 1, wherein said thin metallic film is made from a carbide distributed in a binder.

11. A semiconductor device as defined in claim 10, wherein said carbide is selected from the group consisting of tungsten carbide, titanium carbide and tantalum carbide, and said binder is selected from the group consisting of cobalt, nickel, iron, manganese and chromium.

12. A semiconductor device as defined in claim 1, wherein a foundation plating is interposed between said thin metallic film and said second conductive block.

13. A semiconductor device as defined in claim 2, wherein the amount of molybdenum and tungsten in said thin film is greater than about 25 percent.

14. A semiconductor device as defined in claim 1, wherein said thin metallic film has a thickness of about 5$\mu$.

15. A semiconductor device comprising a semiconductor wafer having at least one junction therein and provided with a base electrode having a coefficient of thermal expansion approximately the same as that of said wafer which is secured on one face of the wafer, another surface of said wafer being provided with an ohmic electrode adhering to said wafer of which the surface is highly smooth; a first conductive block secured to the base electrode; a second conductive block of which the surface facing said ohmic electrode is covered with a thin metallic film having a thickness of about 5 to about 200 microns and having a highly smooth surface, said metallic film having a considerably higher melting point and hardness than said second conductive block; a brittle metallic foil having substantially flat surfaces inserted between said thin metallic film and said ohmic electrode, thereby to allow the compression between the second conductive block and the wafer to be slidable along the contact surfaces; means for completely sealing the wafer from the atmosphere including means for electrically insulating said first and second conductive blocks from each other; cooling means pressed against the outer faces of the conductive blocks; and means for compressing said first and second conductive blocks to the wafer through said brittle metallic foil and said ohmic electrode.

16. A semiconductor device as defined in claim 15, wherein said brittle metallic foil is formed of a silver-base alloy.

17. A semiconductor device as defined in claim 15, wherein said brittle metallic foil is formed of a material selected from the group consisting of Au–10%Si, Au–5%Te, Au–0.1%Si–10%Sb, Au–7%Si–1%Sb, Au–6%Si–1%Sb, Au–1%Sb, Au–6%Si, Au–Sn, Au–Th, Au–Zn, Au–In, Au–Be and Au–Pb.

18. A semiconductor device as defined in claim 15, wherein said brittle metallic foil is a copper-base alloy.

19. A semiconductor device as defined in claim 18, wherein said copper-base alloy is a Cu–Zn alloy.

20. A semiconductor device as defined in claim 18, wherein said copper-base alloy is a Au–Sn–P alloy.

21. A semiconductor device as defined in claim 15, wherein said thin metallic film is a tungsten-cobalt alloy of about 15$\mu$ thickness, said second conductive block is made essentially of copper, and said brittle metallic foil is made of Au–1%Sb alloy having about 100$\mu$ thickness.

22. A semiconductor device as defined in claim 15, wherein said thin metallic film is a tungsten-cobalt alloy of about 15$\mu$ thickness, said second conductive block is made essentially of copper, and said brittle metallic foil is made of Au–7%Si–1%Sb alloy.

23. A semiconductor device as defined in claim 15, wherein said thin metallic film is made from a material selected from the group consisting of tungsten, molybdenum, tungsten-cobalt alloy, molybdenum-cobalt alloy and tungsten-nickel alloy.

24. A semiconductor device as defined in claim 15, wherein said thin metallic film is made from an alloy primarily comprising cobalt.

* * * * *

UNITED STATES PATENT OFFICE
CERTIFICATE OF CORRECTION

Patent No. 3,652,904 Dated March 28, 1972

Inventor(s) Kazusaburo Takahashi et al

It is certified that error appears in the above-identified patent and that said Letters Patent are hereby corrected as shown below:

The following claims 1 to 3 should be inserted in column 6 before claim 4:

1. A semiconductor device comprising a semiconductor wafer having at least one junction therein and provided with a base electrode having a coefficient of thermal expansion approximately the same as that of said wafer which is secured on one face of said wafer, another surface of said wafer being provided with an electrode alloyed to said wafer of which a surface is highly smooth; a first conductive block secured on one face of said base electrode; a second conductive block having a flat surface to be in contact with the surface of said alloyed electrode; the surface of said second conductive block facing said alloyed electrode being covered with a thin metallic film of about 5 to 200 microns in thickness having a considerably higher melting point and hardness than said second conductive block, so that the surfaces between the thin metallic film and the alloyed electrode are slidably compressed along their surfaces without causing an undesirable sticking between said second conductive block and the alloyed electrode; means for completely sealing the wafer from the atmosphere including means for electrically insulating said first and second conductive blocks from each other; cooling means compressed to the outer faces of the conductive blocks; and means for compressing said first and second conductive blocks to said wafer through said alloyed electrode and said base electrode.

FORM PO-1050 (10-69)
USCOMM-DC 60376-P69
★ U.S. GOVERNMENT PRINTING OFFICE : 1969 O—366-334

UNITED STATES PATENT OFFICE
CERTIFICATE OF CORRECTION

Patent No. 3,652,904 Dated March 28, 1972

Inventor(s) Kazusaburo Takahashi et al - 2 -

It is certified that error appears in the above-identified patent and that said Letters Patent are hereby corrected as shown below:

2. A semiconductor device as defined in claim 1, wherein said thin metallic film is made from a material selected from the group consisting of tungsten, molybdenum, tungsten-cobalt alloy, molybdenum-cobalt alloy and tungsten-nickel alloy.

3. A semiconductor device as defined in claim 2, wherein said second conductive block is made of copper.

Signed and sealed this 23rd day of January 1973.

(SEAL)
Attest:

EDWARD M.FLETCHER,JR.
Attesting Officer

ROBERT GOTTSCHALK
Commissioner of Patents